(12) United States Patent
Bryant et al.

(10) Patent No.: US 6,552,396 B1
(45) Date of Patent: Apr. 22, 2003

(54) MATCHED TRANSISTORS AND METHODS FOR FORMING THE SAME

(75) Inventors: Andres Bryant, Essex Junction, VT (US); William F. Clark, Jr., Essex Junction, VT (US); Edward J. Nowak, Essex Junction, VT (US); Minh H. Tong, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/524,295

(22) Filed: Mar. 14, 2000

(51) Int. Cl.[7] ..................... H01L 27/01; H01L 27/088
(52) U.S. Cl. ........................... 257/347; 257/348
(58) Field of Search ..................... 257/202, 204, 257/205, 206, 347, 348, 349, 352, 353, 354

(56) References Cited

U.S. PATENT DOCUMENTS

| | | | |
|---|---|---|---|
| 5,395,778 A | * 3/1995 | Walker | 437/43 |
| 5,525,531 A | 6/1996 | Bronner et al. | |
| 5,541,431 A | 7/1996 | Kawashima | |
| 5,656,845 A | * 8/1997 | Akbar | 257/347 |
| 5,789,781 A | 8/1998 | McKitterick | |
| 5,801,080 A | 9/1998 | Inoue et al. | |
| 5,994,738 A | * 11/1999 | Wollesen | 257/347 |
| 6,130,458 A | * 10/2000 | Takagi et al. | 257/351 |
| 6,133,608 A | * 10/2000 | Flaker et al. | 257/347 |
| 6,211,551 B1 | * 4/2001 | Suzumura et al. | 257/343 |
| 6,274,896 B1 | * 8/2001 | Gibson et al. | 257/259 |
| 6,274,907 B1 | * 8/2001 | Nakagawa | 257/354 |
| 6,324,101 B1 | * 11/2001 | Miyawaki | 365/185.28 |

FOREIGN PATENT DOCUMENTS

JP  60180172 A  9/1985

OTHER PUBLICATIONS

Wolf, S., "Silicon Processing for the VLSI Era", vol. 2—Process Integration, pp. 680–681; Lattice Press, Sunset Beach, CA (1990) (First Ed.) (ISBN: 0–961672–4–5).*
Wolf, S., "Silicon Processing for the VLSI Era", vol. 3: The submicron MOSFET, pp. 601–603; Lattice Press, Sunset Beach, CA (1995) (First Ed.) (ISBN: 0–961672–5–3).*

* cited by examiner

Primary Examiner—Nathan J. Flynn
Assistant Examiner—Johannes P Mondt
(74) Attorney, Agent, or Firm—Dugan & Dugan; Mark F. Chadurjian; Kelly M. Reynolds

(57) ABSTRACT

An SOI multiple FET structure is provided that comprises a substrate having a substrate layer on an insulator layer. The SOI multiple FET structure includes distal diffusion regions in the substrate layer and a central diffusion region in the substrate layer. The central diffusion region has a width and extends from a surface of the substrate layer downward into contact with the insulator layer along a portion of the width and extends only partially into the substrate layer along another portion of the width. The SOI multiple FET structure also includes a pair of gates on the surface of the substrate layer each overlapping one of the distal diffusion regions and the central diffusion region; and a pair of body regions in the substrate layer each under one of the gates for forming a channel between the one of the distal diffusion regions and the central diffusion region. The body regions are in electrical communication under the another portion of the width of the central diffusion region. Methods for forming the SOI multiple FET structure are also provided.

16 Claims, 2 Drawing Sheets

MATCHED TRANSISTORS AND METHODS FOR FORMING THE SAME

FIELD OF THE INVENTION

The present invention relates to electronic circuitry and more particularly to matched transistors and methods for forming the same.

BACKGROUND OF THE INVENTION

Digital and analog circuits often employ transistors having "matched" parameters (i.e., matched transistors). Sense amplifiers, for example, employ matched transistors to optimize circuit performance and to ensure circuit robustness (e.g., as matched transistors are more stable and are less likely to change state during noise events).

Two transistors are matched by ensuring that (1) the transistors have matched physical characteristics (e.g., similar channel lengths, similar channel widths, similar source, drain and channel doping levels, etc.); (2) the transistors have matched electrical characteristics (e.g., similar gains, similar channel resistances, similar threshold voltages, etc.); and (3) the transistors experience similar voltage potentials during operation (e.g., similar gate, source and/or drain potentials, similar body potentials, etc.).

Modern semiconductor device fabrication techniques allow precise control over the doping levels, device geometry and other physical characteristics of metal-oxide-semiconductor-field-effect-transistors (MOSFETs). Therefore, both the physical characteristics and the electrical characteristics of MOSFETs may be easily matched. However, unlike transistors formed on bulk substrates, transistors formed on silicon-on-insulator (SOI) substrates may not behave as matched transistors despite having matched physical and electrical characteristics. Specifically, two SOI transistors having matched physical and electrical characteristics may behave differently (despite being identically biased) due to the effective isolation of each transistor's floating body by fully depleted source/drain junctions (e.g., as each transistor's floating body may reside at a different voltage potential). A need therefore exists for matched SOI transistors and methods for forming such matched SOI transistors.

SUMMARY OF THE INVENTION

To overcome the needs of the prior art, novel matched transistors and methods for forming the same are provided. Specifically, a novel SOI multiple FET structure is provided that comprises a substrate having a substrate layer on an insulator layer. The SOI multiple FET structure includes distal diffusion regions in the substrate layer and a central diffusion region in the substrate layer. The central diffusion region has a width and extends from a surface of the substrate layer downward into contact with the insulator layer along a portion of the width and extends only partially into the substrate layer along another portion of the width.

The SOI multiple FET structure also includes a pair of gates on the surface of the substrate layer each overlapping one of the distal diffusion regions and the central diffusion region; and a pair of body regions in the substrate layer each under one of the gates for forming a channel between the one of the distal diffusion regions and the central diffusion region. The body regions are in electrical communication under another portion of the width of the central diffusion region. Thus, the pair of body regions remain at the same potential during operation of the SOI multiple FET structure. Methods for forming the novel SOI multiple FET structure are also provided.

Other objects, features and advantages of the present invention will become more fully apparent from the following detailed description of the preferred embodiments, the appended claims and the accompanying drawings.

BRIEF DESCRIPTION OF THE DRAWINGS

The present invention is described with reference to the accompanying drawings. In the drawings, like reference numbers indicate identical or functionally similar elements. Additionally, the left-most digit of a reference number identifies the drawing in which the reference number first appears.

DETAILED DESCRIPTION OF THE PREFERRED EMBODIMENTS

Figure 1A:
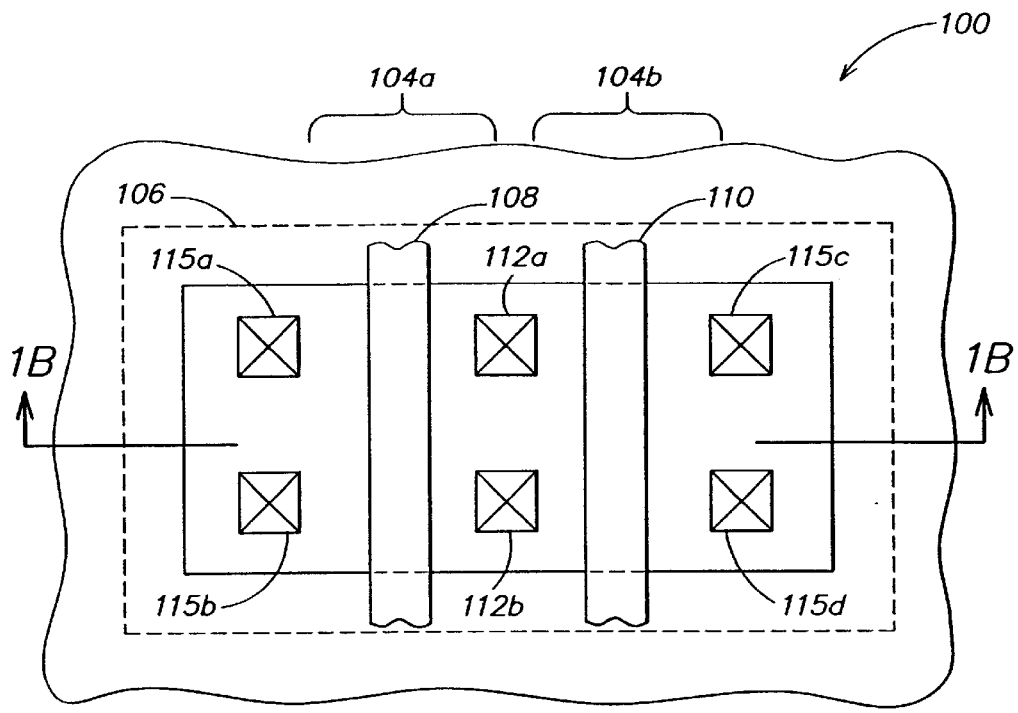
FIG. 1A is a top plan view of a conventional silicon-on-insulator (SOI) multiple field-effect-transistor (FET) structure formed on an SOI substrate.
Figure 1B:
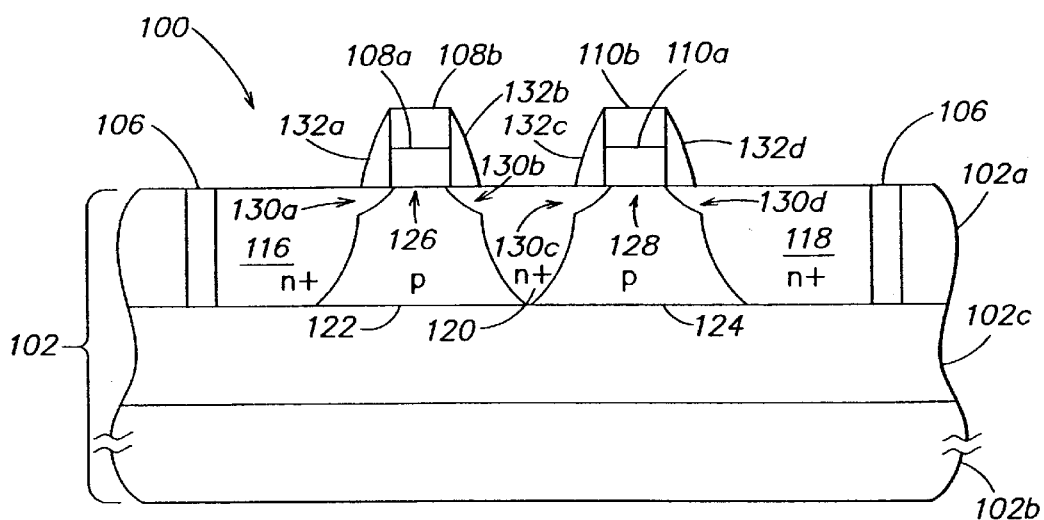
FIG. 1B is a cross-sectional view of the SOI multiple FET structure of FIG. 1A taken along line 1B—1B in FIG. 1A.

FIG. 1A is a top plan view of a conventional silicon-on-insulator (SOI) multiple field-effect-transistor (FET) structure 100 formed on an SOI substrate 102 (FIG. 1B). FIG. 1B is a cross-sectional view of the conventional SOI multiple FET structure 100 of FIG. 1A taken along line 1B—1B in FIG. 1A.

The conventional SOI multiple FET structure 100 comprises two NFETs 104a–b isolated (via an STI region 106) from other devices (not shown) formed on the SOI substrate 102. The first NFET 104a and the second NFET 104b share a drain contact 112a–b. The first NFET 104a has its own source contact 115a–b and the second NFET 104b has its own source contact 115c–d.

With reference to FIG. 1B, the SOI substrate 102 comprises a substrate layer 102a separated from a bulk substrate region 102b by a buried oxide layer 102c. The substrate layer 102a comprises (1) a first n+ diffusion region 116 that forms the source of the first NFET 104a; (2) a second n+ diffusion region 118 that forms the source of the second NFET 104b; and (3) a central n+ diffusion region 120 that forms the drains of the first and the second NFETs 104a–b. The first n+ diffusion region 116 and the central n+ diffusion region 120 define a first p-type body region 122, and the second n+ diffusion region 118 and the central n+ diffusion region 120 define a second p-type body region 124. A first channel region 126 and a second channel region 128 are formed within the first p-type body region 122 and the second p-type body region 124, respectively.

As shown in FIG. 1B, the first p-type body region 122 and the second p-type body region 124 are electrically isolated from one another by the central n+ diffusion region 120, and therefore may reside at different voltage potentials. Accordingly, even though the first NFET 104a is identical to the second NFET 104b (e.g., the same channel length and width, the same doping levels, etc.), the first NFET 104a and the second NFET 104b may not behave as matched transistors when identically biased (e.g., if the first p-type body region 122 and the second p-type body region 124 have different voltage potentials).

The first p-type body region 122 and the second p-type body region 124 become isolated as a consequence of the semiconductor device fabrication process conventionally employed to fabricate the SOI multiple FET structure 100. Therefore, to understand the present invention, a conventional semiconductor device fabrication process for forming the SOI multiple FET structure 100 is described below.

With reference to FIG. 1B, the fabrication of the conventional SOI multiple FET structure 100 begins with the selection of the SOI substrate 102. Preferably the SOI substrate 102 has a substrate layer 102a with a thickness of about 1500 angstroms, although other substrate layer thicknesses may be employed. Once the SOI substrate 102 has been selected, the fabrication process for the SOI multiple FET structure 100 proceeds as follows:

1. the STI region 106 is formed in the SOI substrate 102a (e.g., via conventional shallow trench isolation processing that includes silicon etching of trenches followed by trench filling and planarization of fill material) so as to isolate the conventional SOI multiple FET structure 100 from any other devices formed on the SOI substrate 102;
2. the first and second channel regions 126, 128 are formed (e.g., via ion implantation that preferably results in a channel doping of about $10^{17}$–$10^{18}$ cm$^{-3}$);
3. a gate oxide, preferably having a thickness of about 10–35 Angstroms, is grown on the SOI substrate 102 for subsequent patterning (e.g., so as to form the gate oxides 108a, 110a);
4. a polysilicon layer, preferably having a thickness of about 1500 Angstroms, is deposited over the gate oxide (e.g., for forming the gate metal 108b, 110b);
5. the gate oxide and polysilicon layers are patterned to form the gates 108 and 110, which are preferably spaced by about 750 nanometers;
6. sidewall spacers (not shown) are formed adjacent the gates 108 and 110 (e.g., via the deposition and the patterning of about 100 Angstroms of silicon dioxide as is known in the art);
7. a shallow implant is performed (aligned by the implant spacers) into the SOI substrate 102 so as to form shallow implant regions 130a–d, preferably having a doping level of about $10^{19}$–$10^{20}$ cm$^{-3}$;
8. deep implant spacers 132a–d are formed adjacent the gates 108 and 110 (e.g., via the deposition and patterning of a 500–1000 Angstrom silicon oxide/silicon nitride stack as is known in the art); and
9. a deep implant is performed so as to dope the SOI substrate 102 to a level of about $10^{19}$–$10^{20}$ cm$^{-3}$ (e.g., so as to form the first n+ diffusion region 116, the second n+ diffusion region 118 and the central n+ diffusion region 120).

The deep implant step (step 9 above) is performed with sufficient energy to create low resistance source and drain regions (e.g., the first n+ diffusion region 116, the second n+ diffusion region 118 and the central n+ diffusion region 120) which extend from the top surface of the substrate layer 102 to the buried oxide layer 102c. In this manner, NFETs are formed, and the first p-type body region 122 and the second p-type body region 124 are electrically isolated. The first NFET 104a and the second NFET 104b thereby may not be matched transistors.

Figure 2A:
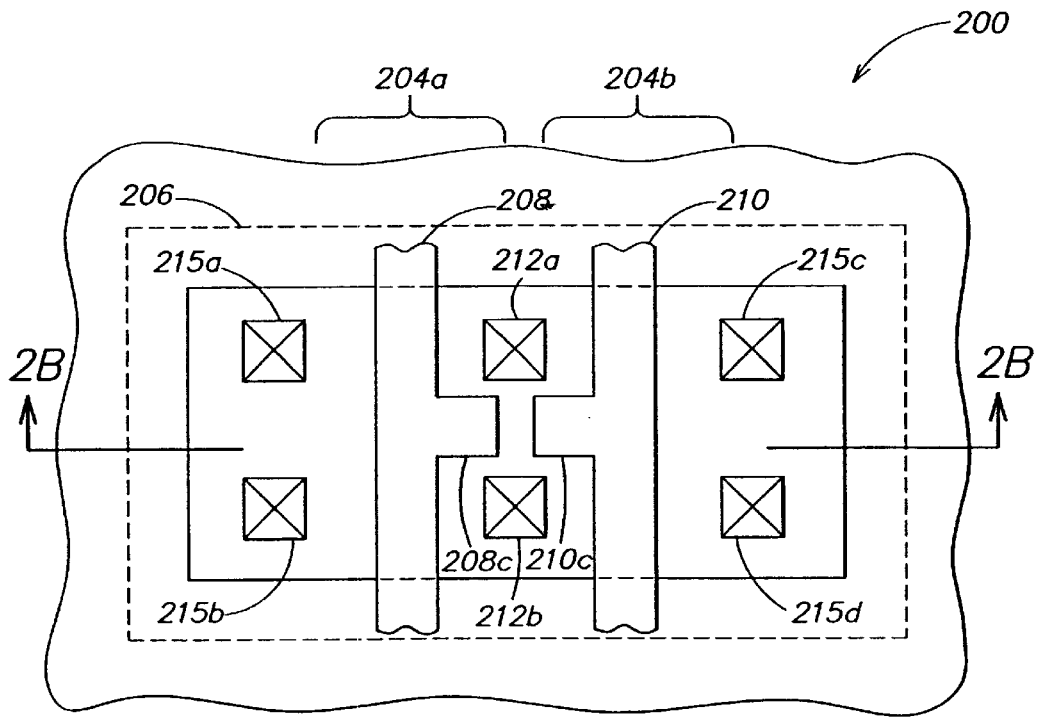
FIG. 2A is a top plan view of an inventive SOI multiple FET structure formed on an SOI substrate in accordance with the present invention.
Figure 2B:
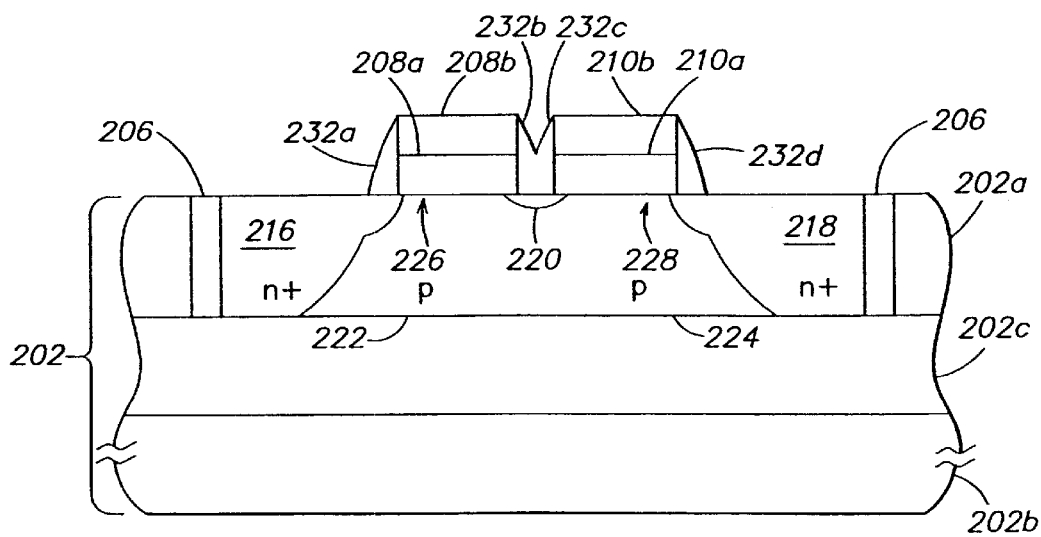
FIG. 2B is a cross sectional view of the inventive SOI multiple FET structure of FIG. 2A taken along line 2B—2B in FIG. 2A.

FIG. 2A is a top plan view of an inventive SOI multiple FET structure 200 formed on an SOI substrate 202 in accordance with the present invention. FIG. 2B is a cross sectional view of the inventive SOI multiple FET structure 200 of FIG. 2A taken along line 2B—2B in FIG. 2A.

The inventive SOI multiple FET structure 200 of FIGS. 2A and 2B is similar to the conventional SOI multiple FET structure 100 of FIGS. 1A and 1B. For example, the inventive SOI multiple FET structure 200 comprises two NFETs 204a–b isolated via an STI region 206 from other devices (not shown) formed on the SOI substrate 202. The first NFET 204a and the second NFET 204b share a drain contact 212a–b. The first NFET 204a has its own source contact 215a–b and the second NFET 204b has its own source contact 215c–d. Note that the source and drain of each transistor are interchangeable as needed by design.

With reference to FIG. 2B, the SOI substrate 202 comprises a substrate layer 202a separated from a bulk substrate region 202b by a buried oxide layer 202c. The substrate layer 202a comprises (1) a first n+ diffusion region 216 that forms the source of the first NFET 204a; (2) a second n+ diffusion region 218 that forms the source of the second NFET 204b; and (3) a central n+ diffusion region 220 that forms the drain of the first and the second NFETs 204a–b. The first n+ diffusion region 216 and the central n+ diffusion region 220 define a first p-type body region 222, and the second n+ diffusion region 218 and the central n+ diffusion region 220 define a second p-type body region 224. A first channel region 226 and a second channel region 228 are formed within the first p-type body region 222 and the second p-type body region 224, respectively.

As shown in FIG. 2B, unlike the first p-type body region 122 and the second p-type body region 124 of the conventional SOI multiple FET structure 100 of FIG. 1B, the first p-type body region 222 and the second p-type body region 224 of the inventive SOI multiple FET structure 200 are not electrically isolated from one another. Therefore, the first p-type body region 222 and the second p-type body region 224 maintain the same voltage potential. Accordingly, unlike the NFETs 104a–b of FIGS. 1A and 1B, the NFETs 204a–b of FIGS. 2A and 2B behave as matched transistors when similarly biased (e.g., as the first p-type body region 222 and the second p-type body region 224 reside at the same the voltage potential).

The inventive SOI multiple FET structure 200 is formed by the same process steps described previously with reference to the conventional SOI multiple FET structure 100 and FIGS. 1A and 1B. However, unlike the first p-type body region 122 and the second p-type body region 124 of the conventional SOI multiple FET structure 100, the first p-type body region 222 and the second p-type body region 224 of the inventive SOI multiple FET structure 200 maintain electrical contact as a consequence of a first extrusion 208cof the first gate 208 that extends toward the second gate 210, and as a consequence of a second extrusion 210c of the second gate 210 that extends toward the first extrusion 208c (FIG. 2A). Specifically, as shown in FIG. 2B, if deep implant spacers 232a–d are employed during formation of the inventive SOI multiple FET structure 200, the first and the second extrusions 208c and 210c extend toward one another a distance sufficient for the second spacer 232b and the third spacer 231c to overlap. In this manner, during the deep implant step described previously (step 9), the implanted dopant atoms will not significantly penetrate the substrate layer 202a within the central n+ diffusion region 220, and the central n+ diffusion region 220 will not extend to the insulator layer 202c. The first p-type body region 222 and the second p-type body region 224 thereby remain in contact.

The lengths of the first and the second extrusions 208c and 210c should be selected so that the second and the third spacers 232b and 232c overlap without the first and the second gates 208 and 210 being shorted together. For example, if the first and the second gates 208 and 210 are spaced by about 750 nanometers, the spacing between the first and the second extrusions 208c and 210c preferably is less than about 170 nanometers. The exact spacing of the first and second extrusions 208c and 210c depends on such factors as the thickness of the deep implant spacers 232a–d and the minimum spacing dictated by photolithographic and process limitations.

By thus providing the first and the second extrusions 208c and 210c, an SOI multiple FET structure with matched FETs is easily formed. Note that the cross-sectional view of the inventive SOI multiple FET structure 200 taken along a line (such as line A—A shown in phantom in FIG. 2A) other than along a line through the first and the second extrusions 208c and 210c appears similar to the cross-sectional view of the conventional SOI multiple FET structure 100 shown in FIG. 1B.

The foregoing description discloses only the preferred embodiments of the invention, modifications of the above disclosed apparatus and method which fall within the scope of the invention will be readily apparent to those of ordinary skill in the art. For instance, the present invention may be similarly employed with p-channel devices to form matched transistor structures (e.g., by reversing the conductivity types of the source/drain and body/channel regions). Further, the first p-type body region 122 and the second p-type body region 124 may be connected via an external contact rather than through use of the first and the second extrusions. The particular oxide thicknesses, spacer thicknesses/materials, doping levels and the like described herein are merely preferred, and other oxide thicknesses, spacer thicknesses/materials, doping levels, etc., may be similarly employed.

Accordingly, while the present invention has been disclosed in connection with the preferred embodiments thereof, it should be understood that other embodiments may fall within the spirit and scope of the invention, as defined by the following claims.

What is claimed is:

1. A matched SOI multiple FET structure within an STI region comprising:
   a substrate having a substrate layer on an insulator layer;
   distal diffusion regions in the substrate layer and a central diffusion region in the substrate layer, the central diffusion region having a width and having a portion extending from a surface of the substrate layer downward only partially into the substrate layer so as not to contact the insulator layer while the distal diffusion regions contact the insulator layer;
   a pair of gates on the surface of the substrate layer, each overlaps one of the distal diffusion regions and the central diffusion region;
   a pair of body regions extending from a surface of the substrate layer down to the insulator layer, each body region under one of the gates for forming a channel between said one of the distal diffusion regions and the central diffusion region, said pair of body regions being in contact with each other directly under said central diffusion region; and
   wherein said body regions being in contact with each other are in electrical communication under said central diffusion region, said structure being isolated via said STI region.

2. The SOI multiple FET structure of claim 1 wherein the multiple FET structure is isolated from other devices in the substrate layer by isolation regions in the substrate layer extending downward into contact with said insulator layer and surrounding the multiple FET structure.

3. The SOI multiple FET structure of claim 1 wherein the distal diffusion regions and the central diffusion region comprise a first conductivity type and wherein the body regions comprise a second conductivity type.

4. The SOI multiple FET structure of claim 1 wherein each gate comprises a gate oxide and a gate metal.

5. The SOI multiple FET structure of claim 1 wherein the pair of gates comprise a first gate and a second gate, the first gate having a first extrusion that extends toward the second gate and the second gate having a second extrusion that extends toward the first extrusion of the first gate, wherein said first and second extrusions allow for said body regions to be in the electrical communication under said central diffusion region.

6. The SOI multiple FET structure of claim 5 wherein the first and the second extrusions are separated by less than about 170 nanometers.

7. The SOI multiple FET structure of claim 5 further comprising a first spacer adjacent the first extrusion and a second spacer adjacent the second extrusion.

8. The SOI multiple FET structure of claim 7 wherein the first and the second spacers overlap.

9. A matched SOI multiple FET structure within an STI region comprising:
   a substrate having a substrate layer on an insulator layer;
   distal diffusion regions in the substrate layer of a first conductivity type and a central diffusion region in the substrate layer of said first conductivity type, the central diffusion region having a width and between a first extrusion and a second extrusion extending from a surface of the substrate layer downward only partially into the substrate layer so as not to contact the insulator layer, the distal diffusion regions contacting the insulator layer;
   a first gate on the surface of the substrate layer overlapping at least one of the distal diffusion regions and the central diffusion region, said first gate having said first extrusion that extends toward a second gate;
   said second gate on the surface of the substrate layer overlapping at least one of the distal diffusion regions and the central diffusion region, said second gate having said second extrusion that extends toward said first gate; and
   a pair of body regions of a second conductivity type extending from a surface of the substrate layer down to the insulator layer, each body region under one of the gates for forming a channel between said one of the distal diffusion regions and the central diffusion region, said pair of body regions being in contact with each other directly under said central diffusion region,
   wherein said first and second extrusions allow for said body regions in contact with each other to be in electrical communication under said central diffusion region, said structure being isolated via said STI region.

10. The SOI multiple FET structure of claim 9 wherein the multiple FET structure is isolated from other devices in the substrate layer by isolation regions in the substrate layer extending downward into contact with said insulator layer and surrounding the multiple FET structure.

11. The SOI multiple FET structure of claim 9 wherein each gate comprises a gate oxide and a gate metal.

12. The SOI multiple FET structure of claim 9 wherein the diffusion regions of the first conductivity type comprise an n+ diffusion regions.

13. The SOI multiple FET structure of claim 12 wherein the diffusion regions of the second conductivity type comprises a p+ diffusion regions.

14. The SOI multiple FET structure of claim 9 wherein the first and the second extrusions are separated by less than about 170 nanometers.

15. The SOI multiple FET structure of claim 9 further comprising a first spacer adjacent the first extrusion and a second spacer adjacent the second extrusion.

16. The SOI multiple FET structure of claim 15 wherein the first and the second spacers overlap.

* * * * *